United States Patent [19]
Lee et al.

[11] Patent Number: 5,801,989
[45] Date of Patent: Sep. 1, 1998

[54] METHOD AND APPARATUS FOR OPTIMIZING ERASE AND PROGRAM TIMES FOR A NON-VOLATILE MEMORY DEVICE

[75] Inventors: Sung-Soo Lee; Jin-Ki Kim, both of Seoul, Rep. of Korea

[73] Assignee: Samsung Electronics, Co., Ltd., Suwon-City, Rep. of Korea

[21] Appl. No.: 762,495

[22] Filed: Dec. 9, 1996

[30] Foreign Application Priority Data

Dec. 11, 1995 [KR] Rep. of Korea ............... 48347/1995

[51] Int. Cl.$^6$ ............... G11C 16/04; G11C 16/06
[52] U.S. Cl. ............... 365/185.22; 365/185.19; 365/185.28; 365/185.29
[58] Field of Search ............... 365/185.22, 185.18, 365/185.19, 185.2, 185.28, 185.29

[56] References Cited

U.S. PATENT DOCUMENTS

| | | | |
|---|---|---|---|
| 5,440,505 | 8/1995 | Fazio | 365/45 |
| 5,511,021 | 4/1996 | Bergemont | 365/185.03 |
| 5,615,147 | 3/1997 | Chang | 365/185.3 |

*Primary Examiner*—David C. Nelms
*Assistant Examiner*—Son Mai
*Attorney, Agent, or Firm*—Marger, Johnson, McCollom, & Stolowitz P.C.

[57] ABSTRACT

A nonvolatile semiconductor memory device optimizes the time required for erasing or programming a cell by determining an optimal initial programming voltage. The initial programming voltage is relatively low and is fixed in the device during a test mode operation. During a normal erasing or programming operation, a programming signal having the initial programming voltage level is applied to the cell. The programmed state of the cell is then checked. If the cell did not program successfully, the voltage of the programming signal is increased and another programming cycle is executed. The programming cycle is repeated until the cell is programmed properly or a maximum number of programming cycles is reached. To determine the optimal initial programming voltage, an automatic programming operation is performed using a relatively low voltage programming signal. If the time required to complete the programming operation exceeds a target programming time, the voltage of the programming signal is repetitively increased, and the programming operation is repeated until the time required for the programming operation is less than the target time. The optimal initial voltage level of the programming signal is then fixed in the memory device by selectively cutting fuses in a trimming address register in a programming circuit which also includes a loop counter for counting the number of programming cycles during a programming operation and a programming signal generator that varies the voltage of the programming signal responsive to a control signal from the loop counter.

22 Claims, 15 Drawing Sheets

METHOD AND APPARATUS FOR OPTIMIZING ERASE AND PROGRAM TIMES FOR A NON-VOLATILE MEMORY DEVICE

This application corresponds to Korean Patent Application No. 48347/1995 filed Dec. 11, 1995 in the name of Samsung Electronics Company, Ltd. and incorporated herein by reference for all purposes.

BACKGROUND OF THE INVENTION

1. Field of the Invention

This invention relates to a non-volatile semiconductor memory device, and more particularly a method and circuit for optimizing erase and program times for a non-volatile semiconductor memory device.

2. Description of the Related Art

An EEPROM memory cell array having a NAND structure includes a number of NAND cell units arranged in rows and columns. FIG. 11 is a drawing of an equivalent circuit of a memory cell array having a typical NAND structure. Referring to FIG. 11, NAND cell units NU1–NUm include first selection transistors 120 having drains connected to corresponding bit lines BL1–BLm and second selection transistors 121 having sources connected to a common source line CSL. A plurality of memory cell transistors M1–M8 (hereinafter referred to as "memory cells") have drain-source channels connected in series between the sources of the first selection transistors 120 and the drains of the second selection transistors 121. The gates of the first selection transistors 120, which are arranged in the same row, control the gates of the memory cells M1–M8, and the gates of the second selection transistors 121 are connected to a first selection line SL1, word lines WL1–WL8, and a second selection line SL2, respectively The first and second selection transistors 120, 121 and the memory cells M1–M8 are formed in a p-type well. In each of the NAND cell units NU1–NUm, the source of the first selection transistor 120, the source-drain common region of the drain of memory cell M1, the source-drain common regions of the memory cells M1–M8, the drain of the second selection transistor 121, and the drain-source common region of the source of memory cell array M8 are all formed in a single p-type well.

Polysilicon floating gates are formed over the channels of the memory cells M1–M8 through a tunnel oxide film which intervenes therebetween. Then, polysilicon floating gates or silicide floating gates with a high melting point are formed over the above stated polysilicon floating gates through another dielectric layer which intervenes therebetween. The drain regions of the first selection transistors 120, which are formed in the p-type well, are connected through openings to corresponding bit lines made of metal or metal silicide with a high melting point. The source regions of the second selection transistors 121, which are also formed in the p-type well, are connected to a common source line CSL which is made of metal or metal silicide with a high melting point. The memory cells must be erased prior to programing data into them.

An erase operation is performed by applying an erase voltage (e.g., 20 V) to the p-type well and a reference voltage (e.g., the ground voltage) to the word lines WL1–WL8. Then, electrons stored in the floating gates move to the p-type well region via the tunnel oxide film, thereby changing the memory cells to enhancement mode transistors. Throughout the specification, it is assumed that an erased memory cell stores data corresponding to a logic level "1".

The memory cells connected to a selected word line can be programmed (i.e., written with data corresponding to a logic level "0") by applying a program voltage (e.g., 18 V) to the selected word line and a reference voltage (e.g., the ground voltage) to the sources and drains of the memory cells to which the data "0" is written. Then, electrons, which move into the floating gates of the memory cells to be programmed via the tunnel oxide film, are stored in the floating gates, thereby changing the programmed memory cells to depletion mode transistors.

Upon completion of the above stated programming, a programming verification operation is performed to verify whether the selected memory cells have been successfully programmed so as to have a predetermined threshold voltage as required. The above stated erasing, programming, and verification techniques are disclosed in co-pending U.S. patent application Ser. No. 08/441,477 which corresponds to Korean Patent Publication No. 94-18870, published on Aug. 19, 1994 and assigned to the present applicant.

To increase the density of an EEPROM, the width and thickness of the gate oxide films and intermediate insulating layers as well as the channel dimensions must be reduced so as to reduce the size of each unit memory cell. However, it is difficult to assure the uniformity of the width and thickness of the oxide films and the intermediate insulating layers as well as the channel dimension when the manufacturing process is changed to reduce the size of each unit memory cell. As a result, the threshold voltages of the programmed memory cells become nonuniform. If any one of the programmed memory cells does not reach the predetermined threshold voltage, erroneous data may be generated.

In order to solve such problems, a program verification device has been proposed to verify whether selected memory cells are successfully programmed. For example, Korean Patent Publication No. 94-18870, discussed above, discloses such a program verification device.

In a non-volatile semiconductor memory device having erasing and programming modes as stated above, the time required for performing the erasing and programming operations depends upon the voltage level generated by an internal high voltage generator as well as the coupling ratio which is determined by the thickness of the tunnel oxide on the memory cells. Thus, the time required for erasing and programming the memory cells varies with changes in the manufacturing process, thereby reducing the performance of the semiconductor memory device

SUMMARY OF THE INVENTION

Since the erasing and programming times are directly linked to the erasing and programming voltage levels, the reliability and performance of a non-volatile semiconductor memory device can be improved by optimizing the high voltage level of a programming signal.

It is therefore an object of the present invention is to provide a circuit and method for optimizing the high voltage level of a programming and erasing signal in a non-volatile semiconductor memory device so as to optimize the time required for erasing and programming operations.

Another object of the present invention is to improve the reliability of a non-volatile semiconductor memory device A further object of the present invention is to provide a non-volatile semiconductor memory device capable of minimizing the erasing and programming times regardless of changes in the manufacturing process.

To achieve these and other objects, the applicants have invented a method and apparatus for erasing and programming a nonvolatile semiconductor memory cell by applying a programming signal that has a relatively low initial voltage level to the cell. The programmed state of the cell is then checked, and if the programming operation was successful, no further steps are needed. If, however, the cell was not program properly, the voltage of the programming signal is increased from the initial level by a predetermined amount and the programming operation is repeated. The state of the cell is then checked again, and if it was still not programmed properly, additional program cycles are repeated until the proper programming of the cell is verified. For each programming cycle, the voltage of the programming signal is increased, the programming signal is applied to the cell, and the programmed state of the cell is rechecked. The number of programming cycles, or loops, is limited to a maximum number by a counter that is incremented each time the programming cycle is repeated.

To further optimize the programming operation, an optimal initial voltage level for the programming signal is determined during a test mode operation. The optimal initial voltage level is then fixed in the memory device for use during real programming and erasing operations.

A method for determining the optimal initial voltage level in accordance with the present invention includes generating a programming signal having a relatively low voltage level and then performing an automatic programming operation on a cell using the programming signal. The amount of time required to perform the automatic programming operation is determined and compared to a target programming time. If the time required to program the cell exceeds the target time, the voltage level of the programming signal is increased and the automatic programming operation is repeated. If the time required to program the cell still exceeds the target time, the automatic programming operation is repeated with an increase in voltage level of the programming signal at each repetition until the time required to program the cell does not exceed the target programming time. The voltage level of the programming signal after the final iteration is then the optimum initial voltage level for the programming signal.

Another aspect of the present invention is a semiconductor memory device that includes memory cells on which erasing, programming and verification operations are performed in sequence. The device further includes a loop number counter for generating a voltage pumping level control signal so as to increase the voltage of erasing and programming signals from an initial level step by step when the erasing and programming operations are repeated; a high voltage generator for generating a high voltage signal which increases step by step in response to the voltage pumping level control signal; and setting means including a plurality of fuses for fixing the initial voltage level of the programming signal. The setting means supplies trimming signals for varying a setting signal to the loop number counter in response to address signals applied during an operation test mode. The setting means also supplies a setting signal to the loop number counter in response to the address signals. The setting signal is for fixedly setting an optimal initial level for operation time of a mode established during a real operation mode by cutting out selected fuses based on the results of the test mode operation.

An EEPROM according to the present invention includes a plurality of floating gate-type memory cells, programming means for programming selected memory cells, and verification means for verifying whether the selected memory cells are successfully programmed.

A high voltage generator according to the present invention includes a charge pump for generating a programming voltage signal during a programming operation; a level detector for detecting a level of the program voltage signal so as to increase the program voltage step by step whenever the selected memory cells are unsuccessfully programmed; a comparator for comparing the detected level with a reference voltage to generate a comparison signal; and a high voltage controller for activating the charge pump in response to the comparison signal from the comparator.

The foregoing and other objects, features and advantages of the invention will become more readily apparent from the following detailed description of a preferred embodiment of the invention which proceeds with reference to the accompanying drawings.

10A-10C are timing diagrams showing the operation of an embodiment of a programming circuit in accordance with the present invention during a test mode operation.

Figure 11:
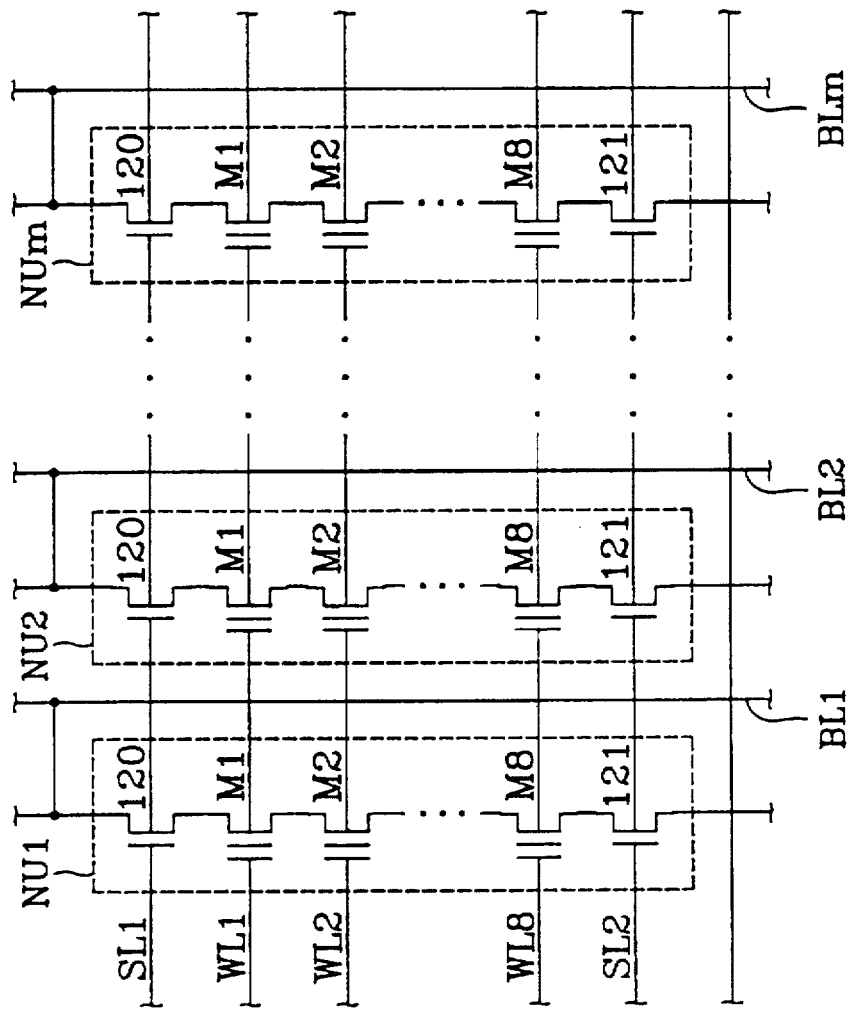

FIG. 11 is an equivalent circuit diagram showing a prior art memory cell array having a NAND structure.

DETAILED DESCRIPTION OF THE PREFERRED EMBODIMENT

An embodiment according to the present invention described hereinbelow utilizes N-channel depletion transistors (hereinafter, referred to as "D-type transistors") with a threshold voltage of about −1.8 V, N-channel enhancement transistors (hereinafter, referred to as "N-type transistors") with a threshold voltage of about 0.7 V, and P-channel MOS transistors (hereinafter, referred to as "P-type transistors") with a threshold voltage of about −0.9 V.

Figure 1:
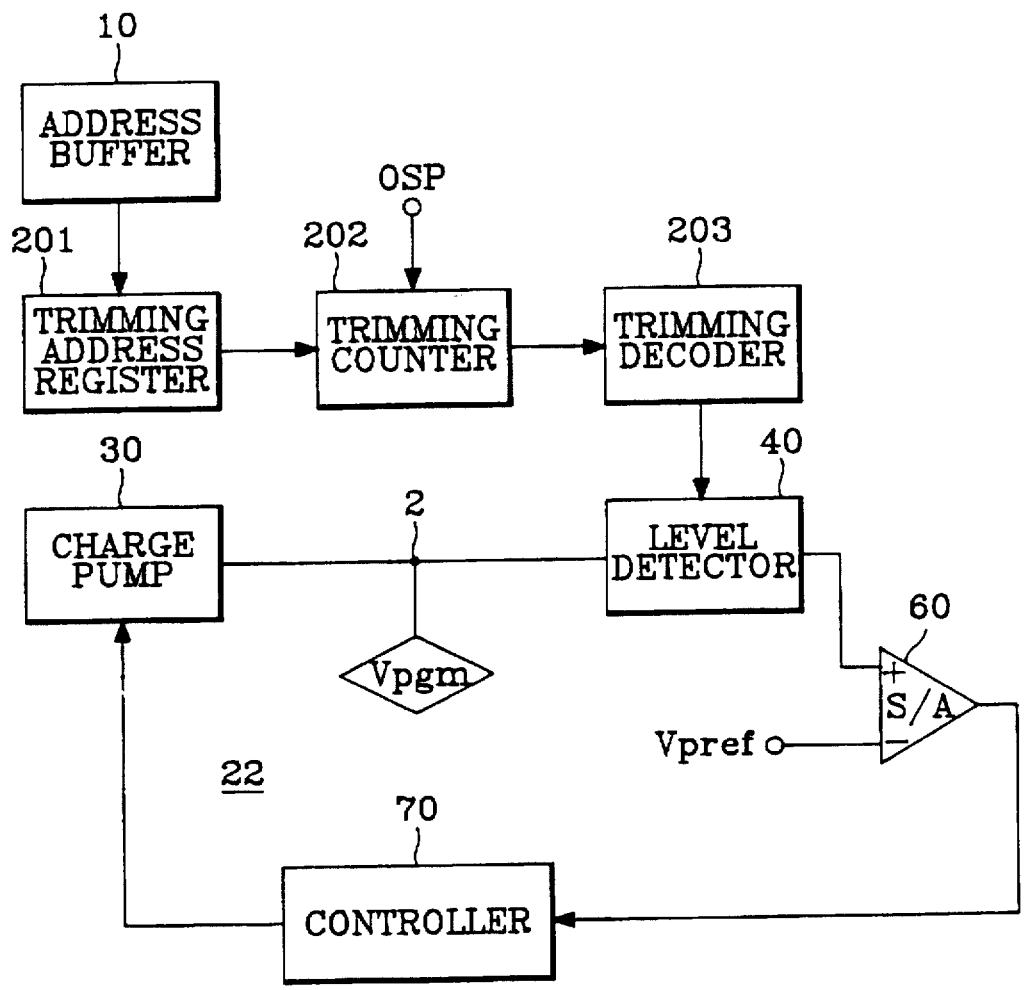
FIG. 1 is a block diagram of an embodiment of a high voltage optimization circuit according to the present invention.

Referring to FIG. 1, a block diagram of an embodiment of a high voltage optimization circuit according to the present invention is illustrated schematically. A trimming counter 202 and a trimming decoder 203 serve as a loop number counter for generating a voltage pump control signal for pumping up the erasing voltage and the programming voltage step by step from an initial level, whenever the erasing and programming operations are repeated. A high voltage generator 22 includes a charge pump 30, a level detector 40, a comparator 60, and a controller 70.

A trimming address register 201 includes a plurality of fuses and generates trimming signals for the loop number counter to change the initial voltage level in response to address signals applied during a test operation. In response to a plurality of address signals, the trimming address register 201 generates a setting signal for the loop number counter to set an appropriate initial level for the operation mode by cutting out selected fuses based on the results of the test operation. The trimming address register 201 receives the address signals from an address buffer 10. The trimming counter 202 receives program loop pulses from a program verification circuit of a semiconductor memory device so as to count the number of programming cycles.

Figure 4A:
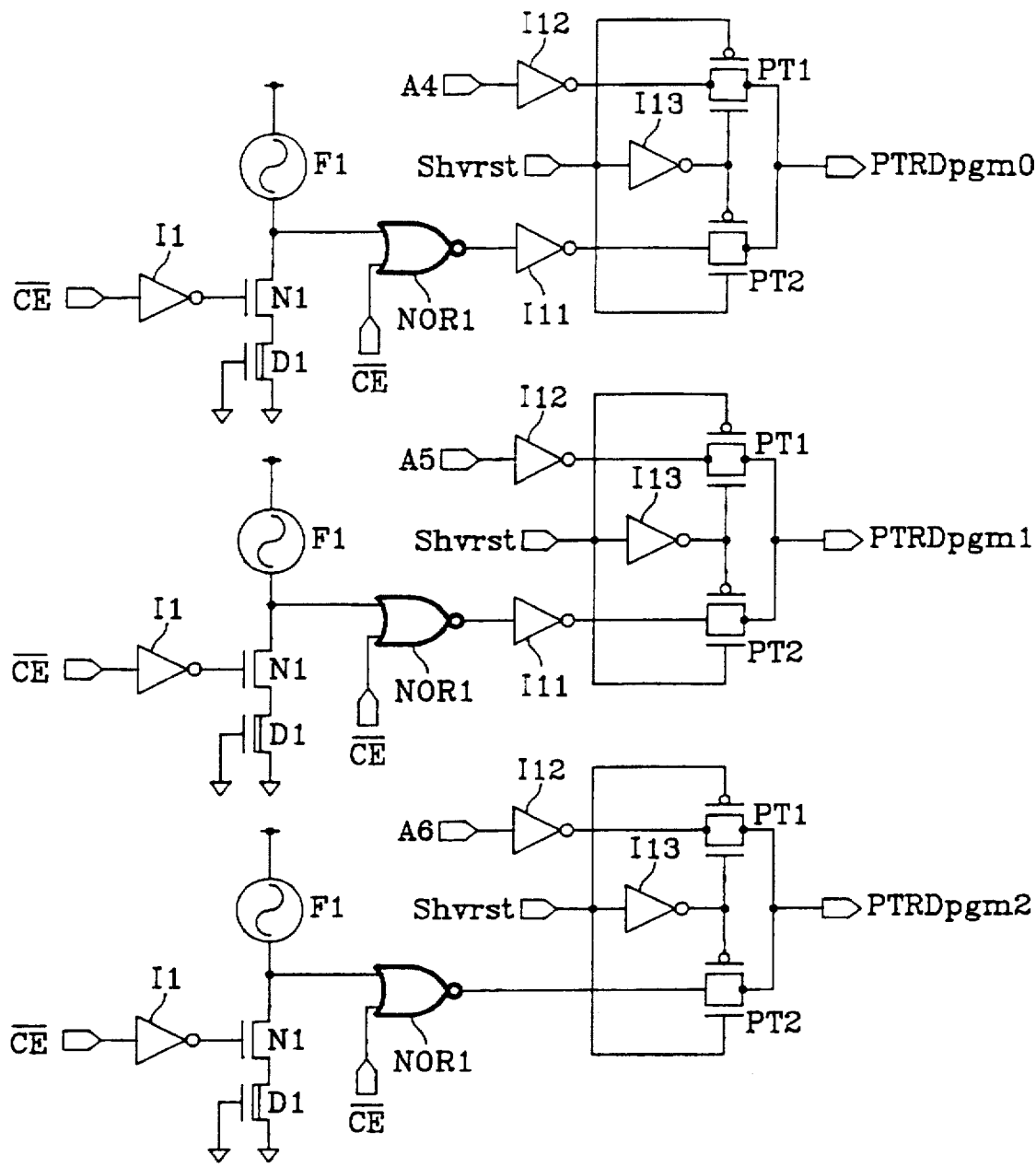
FIGS. 4A, 4B and 5 are circuit diagrams showing more details of the trimming address register of FIG. 1.
Figure 4B:
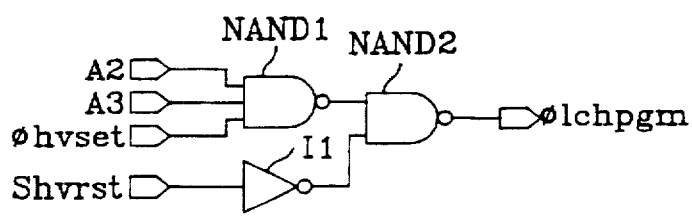
Figure 5:
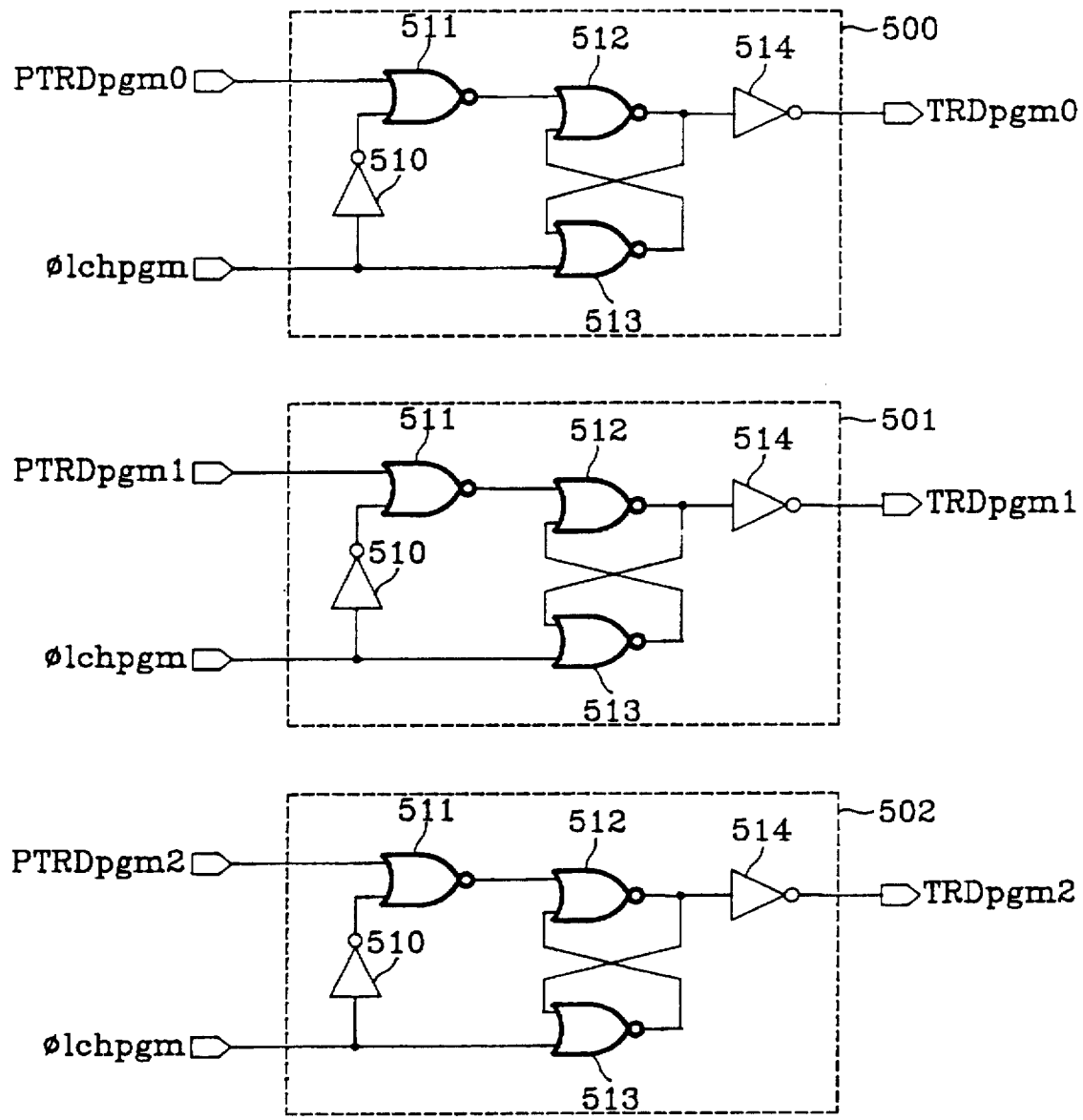

FIGS. 4A, 4B and 5 show more detailed circuit diagrams of the trimming address register 201 of FIG. 1. More specifically, FIG. 4A illustrates a circuit for generating preliminary counting signals PTRDpgm0–PTRDpgm2 which are used for generating counting signals TRDpgm0–TRDpgm2 at a following stage. The circuit is divided into three sections, each section having the same structure but receiving different address signals. An address signal A4 is applied to the first section, an address signal A5 to the second section, and an address signal A6 to the third section. Each of the sections includes an inverter I1 for receiving a chip enable signal, a fuse F1, an NMOS transistor N1, a depletion transistor D1, a NOR gate NOR 1, an inverter I11, an inverter I12 for receiving the address signal, an inverter I13 for receiving a signal Shvrst, and transmission gates PT1 and PT2.

FIG. 4B illustrates a circuit block for generating a signal φ1chpgm. This circuit block includes a three-input NAND gate NAND1, an inverter I1 for inverting the signal Shvrst, and a NAND gate NAND2.

FIG. 5 illustrates register blocks 500, 501, and 502 for receiving the signals PTRDpgm0–PTRDpgm2 and φ1chpgm from the circuits of FIGS. 4A and 4B and generating the counting signals TRDpgm0–TRDpgm2. Each of the blocks includes an inverter 510, a NOR gate 511, two NOR gates 512, 513 which form a latch, and an inverter 514 for inverting the output of the latch.

Figure 6A:
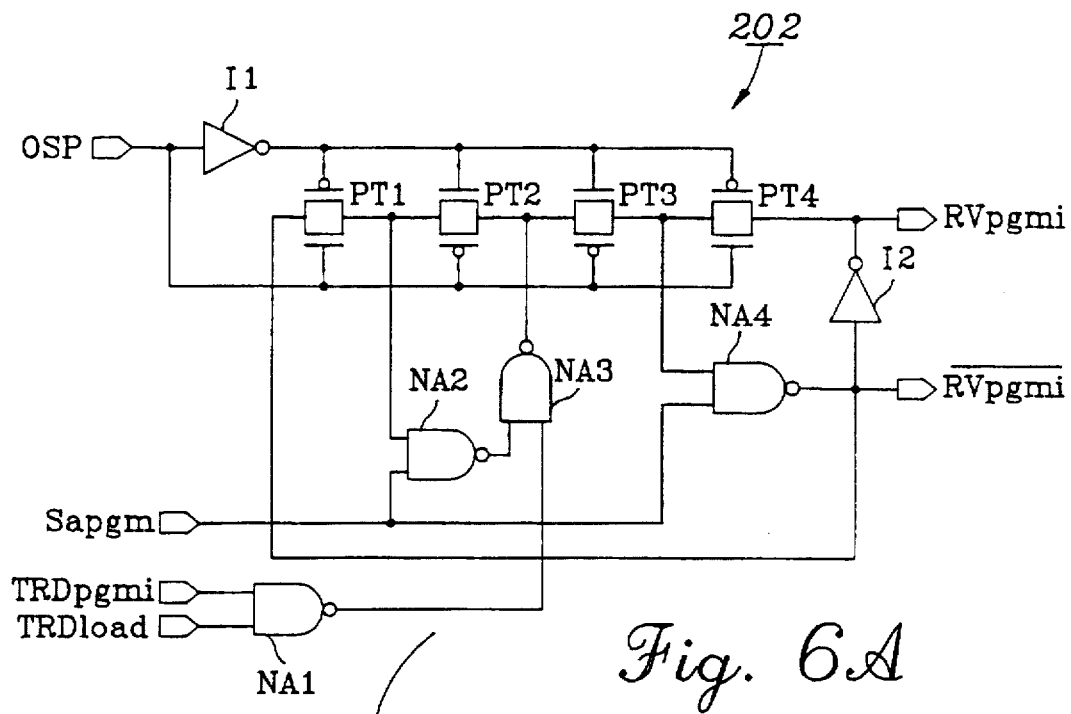
FIGS. 6A and 6B are circuit diagrams showing more details of the trimming counter of FIG. 1.
Figure 6B:
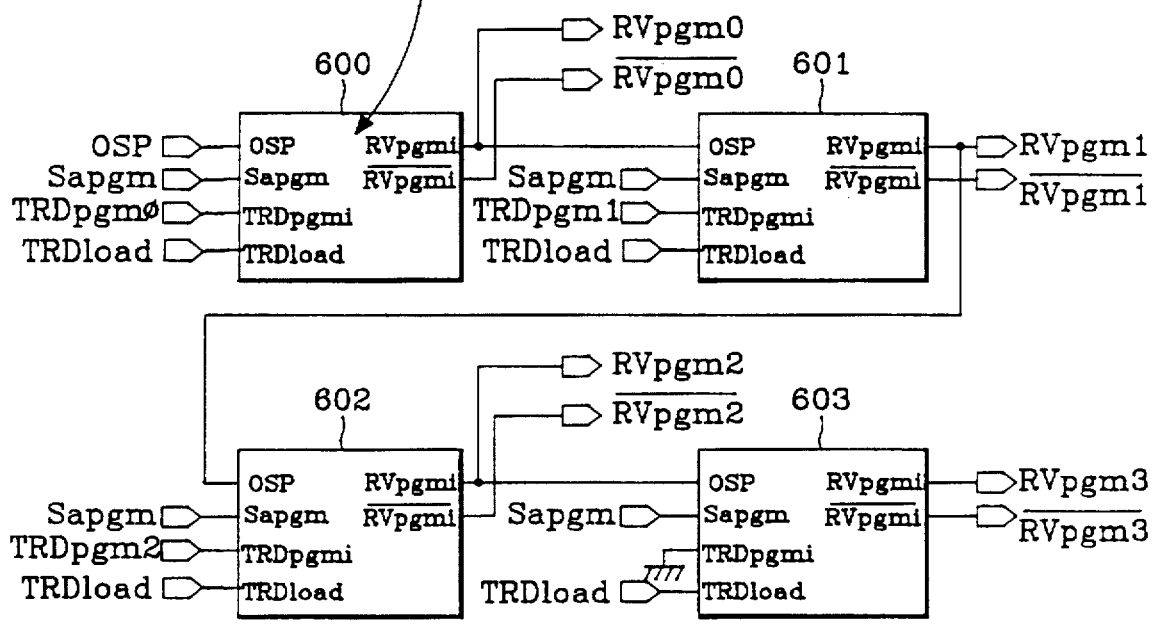

FIG. 6B, is a circuit diagram showing more details of the trimming counter 202 of FIG. 1. The trimming counter 202 according to the present invention includes four counter stages 600–603 which are connected as shown in the drawing.

FIG. 6A is a circuit diagram showing more details of the counter stages from FIG. 6B. Each of the counter stages includes an inverter I1 with an input node coupled to receive a loop pulse signal OSP. Each counter stage also includes four transmission gates PT1–PT4. Each transmission gates includes a first gate coupled to receive the output signal of the inverter I1 and a second gate coupled to receive the loop pulse signal OSP. Each counter stage further includes NAND gates NA1–NA4 for receiving the signals Sapgm, TRDpgmi, and TRDload and an inverter I2 for generating an output signal RVpgmi and its complementary signal/ RVpgmi.

Figure 7:
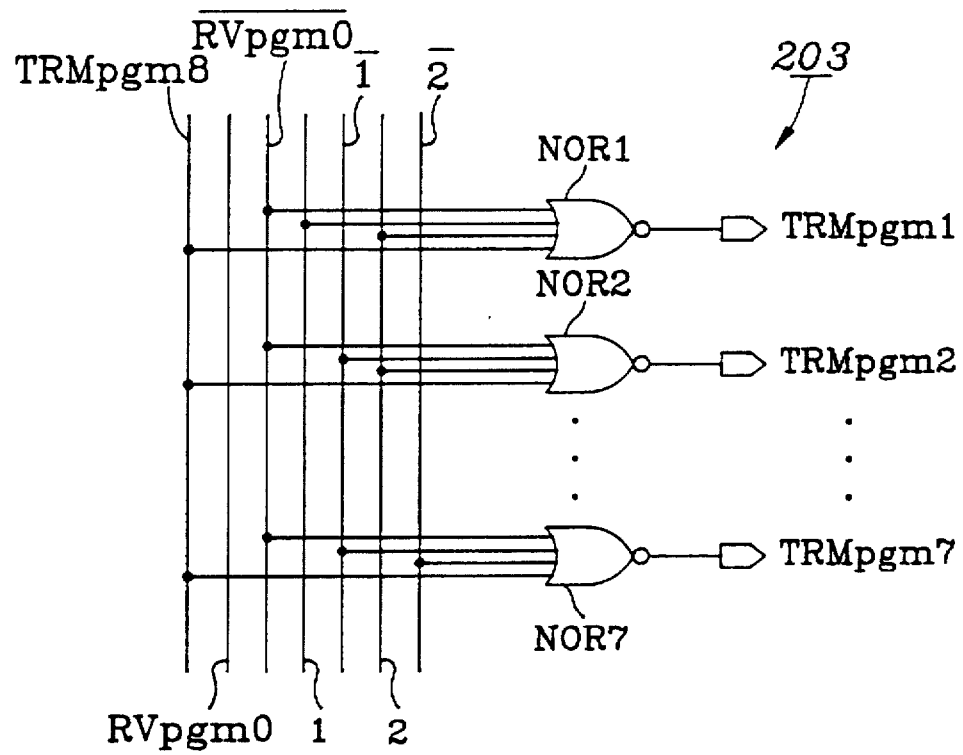
FIG. 7 is a circuit diagram showing more details of the trimming decoder of FIG. 1.
Figure 7:
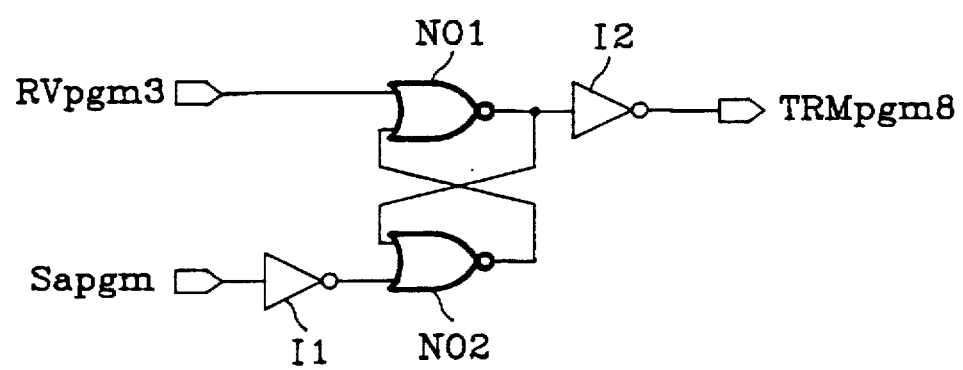

FIG. 7 shows a detailed circuit diagram of the trimming decoder 203 of FIG. 1. An embodiment of a trimming decoder 203 according to the present invention includes NOR gates NOR1–NOR7 for generating trimming signals TRMpgm1–TRMpgm7, inverters I1 and I2 for generating a trimming signal TRMpgm8, and NOR gates NO1 and NO2 which form a latch. The output signals of trimming decoder 203 are supplied to the level detector 40 of FIG. 1 and control the output voltage of the programming signal generator.

Figure 8:
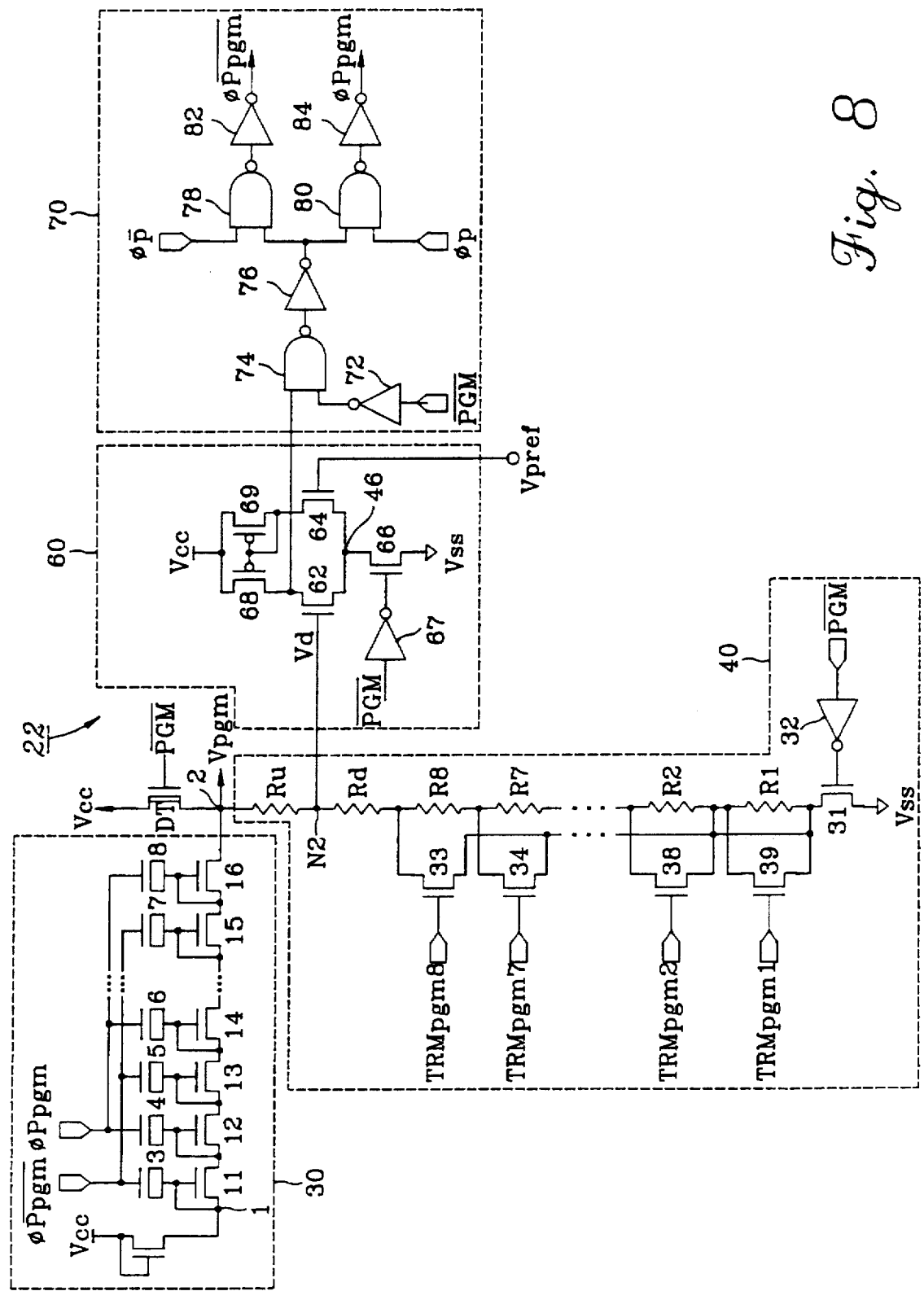
FIG. 8 is a circuit diagram showing more details of the high voltage generator of FIG. 1.

FIG. 8 shows a detailed circuit diagram of the high voltage generator 22 of FIG. 1. The high voltage generator 22 includes the charge pump 30 for generating a high voltage programming signal for the programming mode of operation, the level detector 40 for detecting the level of the programming voltage so as to allow the programming voltage to increase step by step within a specific voltage range, the comparator 60 (which is implemented with a differential amplifier) for comparing the detected voltage level with a reference voltage to generate a comparison signal, and the high voltage controller 70 for activating the charge pump 30 in response to the comparison signal output from the comparator 60.

The charge pump 30 generates a program voltage signal Vpgm in response to charge pumping signals φPpgm and /φPpgm from the high voltage controller 70 during erase or programming operations. The charge pump 30 employs a charge pump method to generate the high voltage signal Vpgm which has a higher voltage than the power supply voltage Vcc. The charge pump 30 includes an N-type transistor 17 for providing an initial voltage of Vcc-Vth at a node 1, N-type transistors 11–16 connected in series between the node 1 and an output node 2, and MOS capacitors 3–8 which are connected to the gates of the N-type transistors 11–16, respectively. Each of the N-type transistors 11–16 is diode connected (gate connected to drain). The drain-source common connections of the odd numbered MOS capacitors 3, 5, 7 are coupled to the charge pumping signal /φPpgm, and the drain-source common connections of the even numbered MOS capacitors 4, 6, 8 are coupled to the charge pumping signal φPpgm.

A D-type transistor DT has a channel connected in series between the output node 2 of the charge pump 30 and the power supply voltage Vcc. The gate and a drain of the D-type transistor DT are connected to a program control signal/PGM and the power supply signal Vcc, respectively. Upon completion of a programming operation, the D-type transistor DT discharges charge pump, thereby reducing the program voltage Vpgm of the charge pump 30 to the power supply voltage Vcc.

The level detector 40 is connected to the output node 2 of the charge pump 30 and increases the program voltage Vpgm step by step during programming operations. The level detector 40 includes an N-type transistor 31 and resistors R1–R8, Rd, and Ru which are connected in series between the reference voltage Vss (e.g., ground voltage) and the output node 2. Thus, resistors R1–R8, Rd, and Ru form a resistive voltage divider for dividing the voltage of the programming signal. The gate of N-type transistor 31 is connected to the program control signal/PGM through an inverter 32. The drains of transistors 33–39 are connected to the connection points between resistors Rd, R1–R8. The sources of transistors 33–39 are connected together and to the connection between the resistor R1 and the D-type transistor 31. The gates of transistors 33–39 are coupled to receive the trimming signals TRMpgm1–TRMpgm8, which control the output voltage of the programming signal generator. The transistors 33–39 functions as bypass means for bypassing the resistors R1–R8 in sequence.

The comparator 60 compares the voltage at node N2 with a reference voltage Vpref during programming operations. The comparator 60 includes a transistor 66 having a channel connected between the reference voltage Vss and a common node 46, and a gate coupled to the program control signal/ PGM through an inverter 67. The channels of a P-type transistor 69 and an N-type transistor 64 are connected in series between the power supply voltage Vcc and the common node 46, thereby forming a first branch. In a similar manner, the channels of a P-type transistor 68 and an N-type transistor 62 are connected in series between the power supply voltage Vcc and the common node 46, thereby forming a second branch. The first branch is connected in parallel with the second branch. The gates of the P-type transistors 68, 69 are connected in common to a node formed between the transistors 69, 64. The N-type transistor 64 has a gate connected to the reference voltage Vpref. With this configuration, the comparator 60 generates a logic "L" state (low signal) when Vd>Vpref, and a logic "H" state (high signal) when Vd<Vpref.

The high voltage controller 70 is connected between the comparator 60 and the charge pump 30, and controls the program voltage Vpgm so as to maintain it at a predetermined constant level. The controller 70 includes a NAND gate 74 having a first input terminal connected to the output terminal of the comparator 60 and a second input terminal connected to the program control signal/PGM through an inverter 72. NAND gates 78, 80 have first input terminals connected in common to the output of the NAND gate 74 through an inverter 76, and second input terminals connected to clock pulse signals/φp and φp, respectively. Clock pulse signals/φp and φp are generated from a ring oscillator (not shown) which generates pulses at about 8 MHz. The NAND gates 78, 80 generate the charge pump signals φPpgm and/φPpgm through inverters 82, 84, respectively.

The voltage Vd increases and decreases in response to increases and decreases in the program voltage Vpgm. The high voltage controller 70 is deactivated when Vd>Vpref and activated when Vd<Vpref. When the high voltage controller 70 is deactivated, the charge pump 30 stops pumping charge, and thus, the program voltage Vpgm is reduced. Likewise, when the program voltage Vpgm decreases and the controller is activated, the charge pump 30 raises the program voltage Vpgm. In this manner, the controller maintains the program voltage Vpgm at a predetermined level.

Examples of a programming operation and a test mode operation in accordance with the present invention will now be described with reference to FIGS. 2, 3, 9A–9C and 10A–10C.

Figure 3:
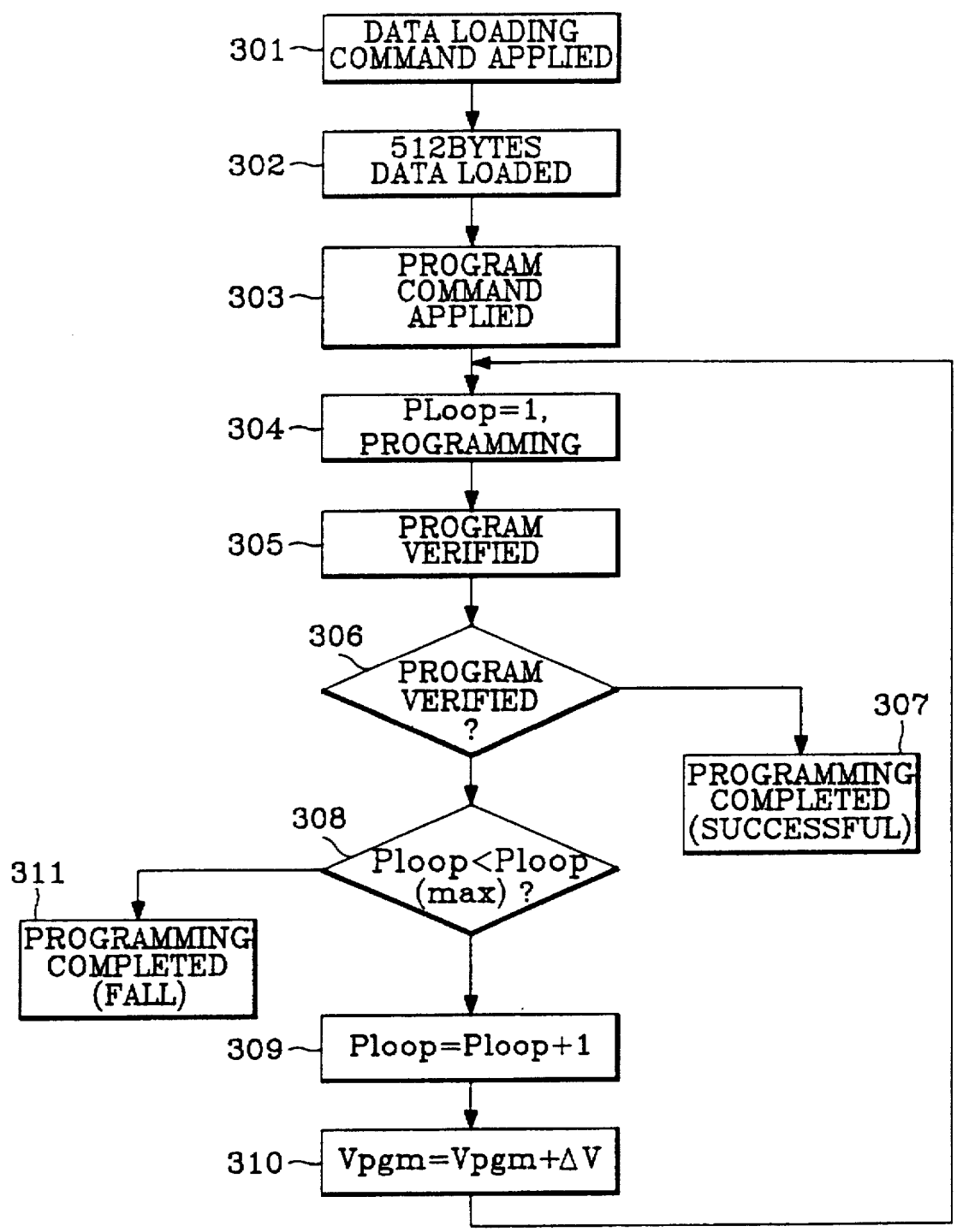
FIG. 3 is a flow chart showing a programming operation of the memory cells according to an embodiment of the present invention.

FIG. 3 is a flow chart showing a programming operation of the memory cells according to an embodiment of the present invention. Referring to FIG. 3, a loading command of "80h" is applied to a page buffer of the semiconductor memory device at step 301. Then, 512 bytes of data are loaded into the page buffer at step 302. A program command of "80h" is applied at step 303 and a unit programming operation begins at step 304. Thereafter, the programming operation is verified at step 305 and the result of the verification is checked out at step 306. If the program verification is successful, the process advances to step 307.

However, if any one of the memory cells are not programmed properly, the loop number is checked at step 308. If the loop number is less than a predetermined maximum loop number Ploop(max), the loop number is increased by one at step 309, the program voltage is raised at step 310, and the process returns to step 304. Otherwise, if the loop number reaches the predetermined maximum loop number and the threshold voltage has still not reached the predetermined voltage (i.e., the programming operation was not successful) the process stops at step 311. Thus, the program voltage increases by ΔV step by step at step 310 during the programming until either the program operation is successfully completed or the loop number reaches the maximum loop number.

During a test mode, the high voltage optimization circuit according to the present invention increases the initial program voltage step by step to detect an optimal initial voltage level. Then, it selectively cuts out the fuses in the trimming address register 201 of FIG. 1 so that the circuit generates the optimal initial voltage for programming the memory cells for an optimal time. If the voltage required for programming the device increases during real operation, the circuit increases the program voltage step by step from the optimal initial level during programming operations.

Figure 2:
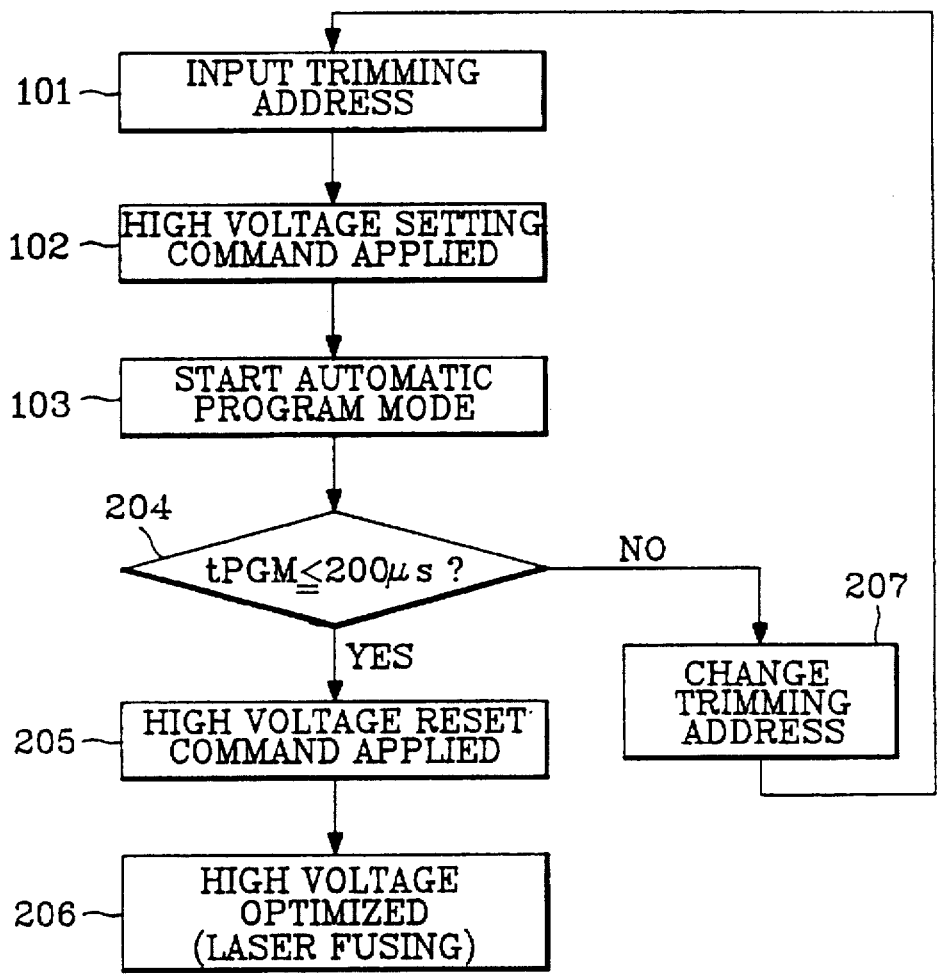
FIG. 2 is a flow chart showing an optimization test operation according to an embodiment of the present invention.

FIG. 2 shows a flow chart of the program test operation which is executed prior to cutting out the fuses (i.e., during the test mode). It is assumed that the target program time required for programming is 200 μsec maximum. In step 101, an address signal for trimming is applied to the trimming address register 201 through the address buffer 10. This address signal is applied to the address input terminals of FIGS. 4A and 4B, during the time interval T11 of FIGS. 10A–10C. Upon applying the address signal, a high voltage setting command of "D5h" is applied at step 102, and then an automatic program mode is executed at step 103. The high voltage setting command is applied during the time interval T22 of FIGS. 10A–10C, and the automatic program mode is executed during time interval T33.

In step 204, it is determined whether or not the programming time required for the program mode is less than the predetermined target time (200 μsec). If the programming is not completed within the predetermined programming time, the address signal is changed at step 207 and the process returns to step 101 to repeat the process. If the program time required for testing the memory chip is, for example, 300 μsec, an address signal that raises the program voltage must be applied to the trimming address register.

If, however, the programming is completed within the predetermined programming time, a high voltage reset command of "F5h" is applied at step 205. Then, the fuses in the trimming address register are selectively cut out at step 206 to fix the initial program voltage level for use in real program mode. The fuses may be cut out by means of light beams such as laser beams.

Thus, the optimal initial programming voltage level is detected by varying the logic states of the addresses so as to increase the initial voltage for the real programming mode, and the initial level increases by a specific level step by step as the verification number increases.

An example of the operation of the present invention will be described in more detail with reference to FIGS. 9A–9C and 10A–10C. For purposes of this example, it will be assumed that the target program time and the measured program time are as stated above. It will also be assumed that the initial programming voltage level is 15.5 V and that the measured program time changes to 200 μsec when the initial level is set 0.5 V higher. The initial programming voltage level of 15.5 V is relatively low as compared to 18 V and 20 V which are typically used to erase and program an EEPROM memory cell, respectively, in prior art systems.

Figure 9A:
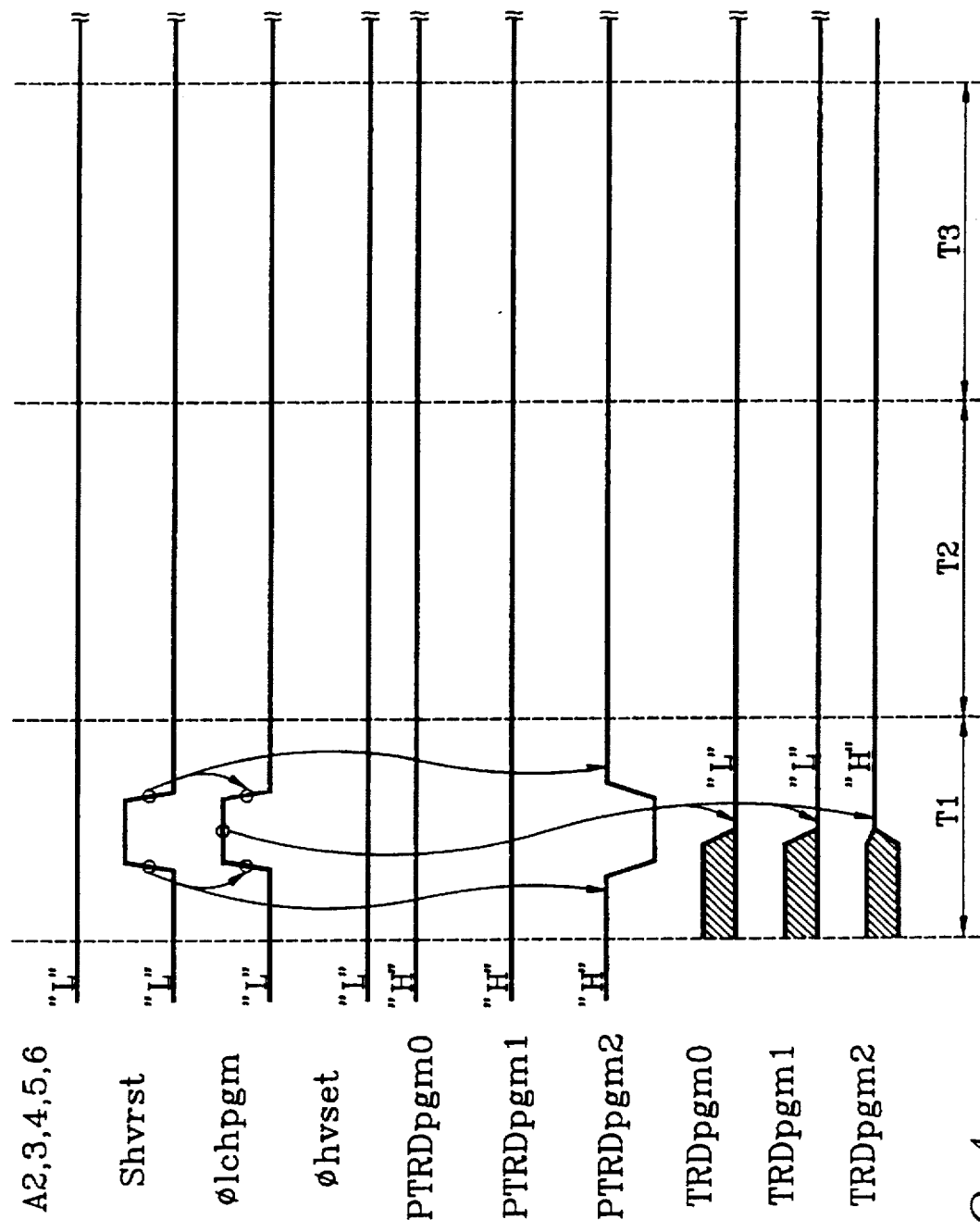
FIGS. 9A-9C are timing diagrams showing the operation of an embodiment of a programming circuit in accordance with the present invention during a programming operation.
Figure 9B:
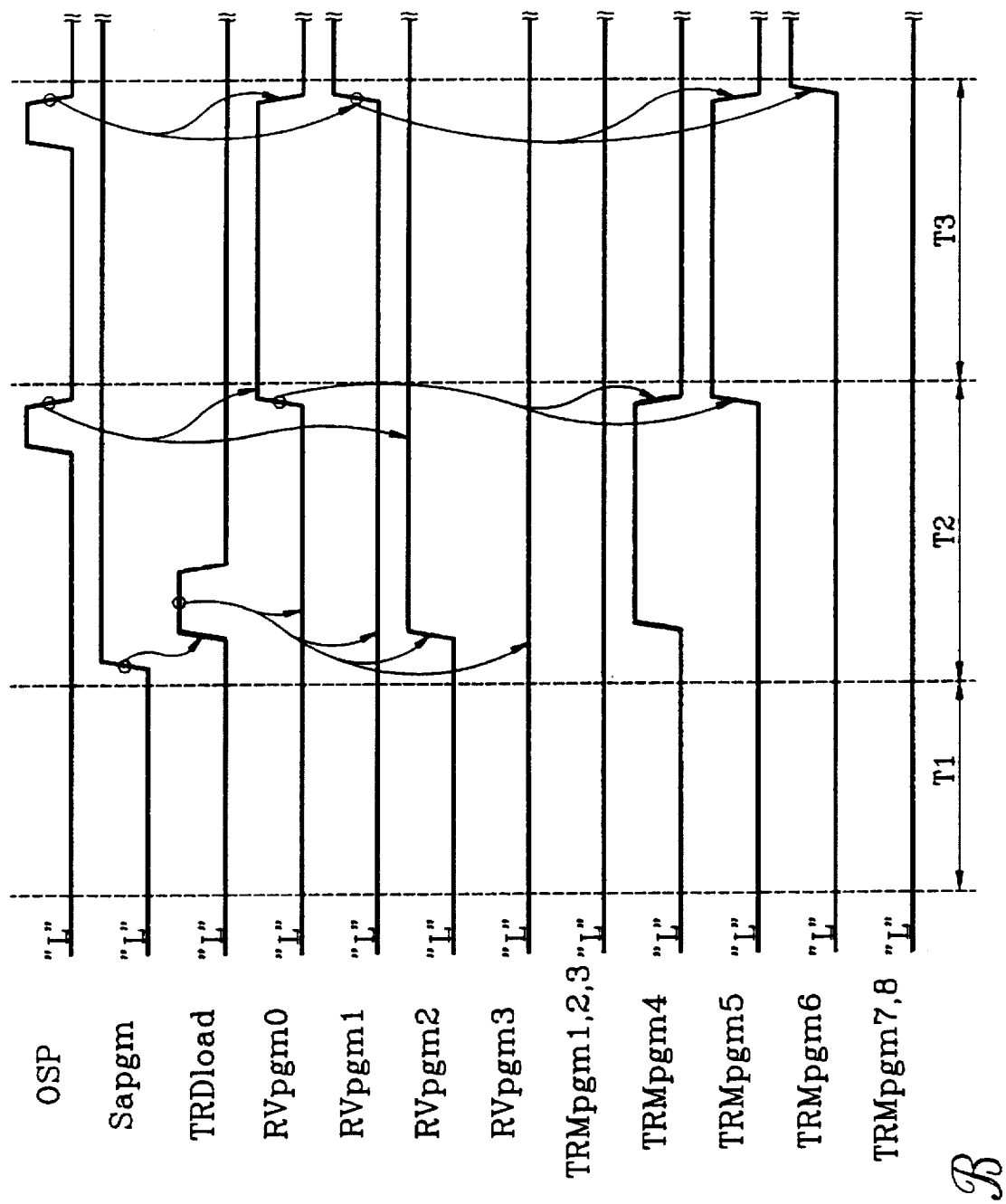
Figure 9C:
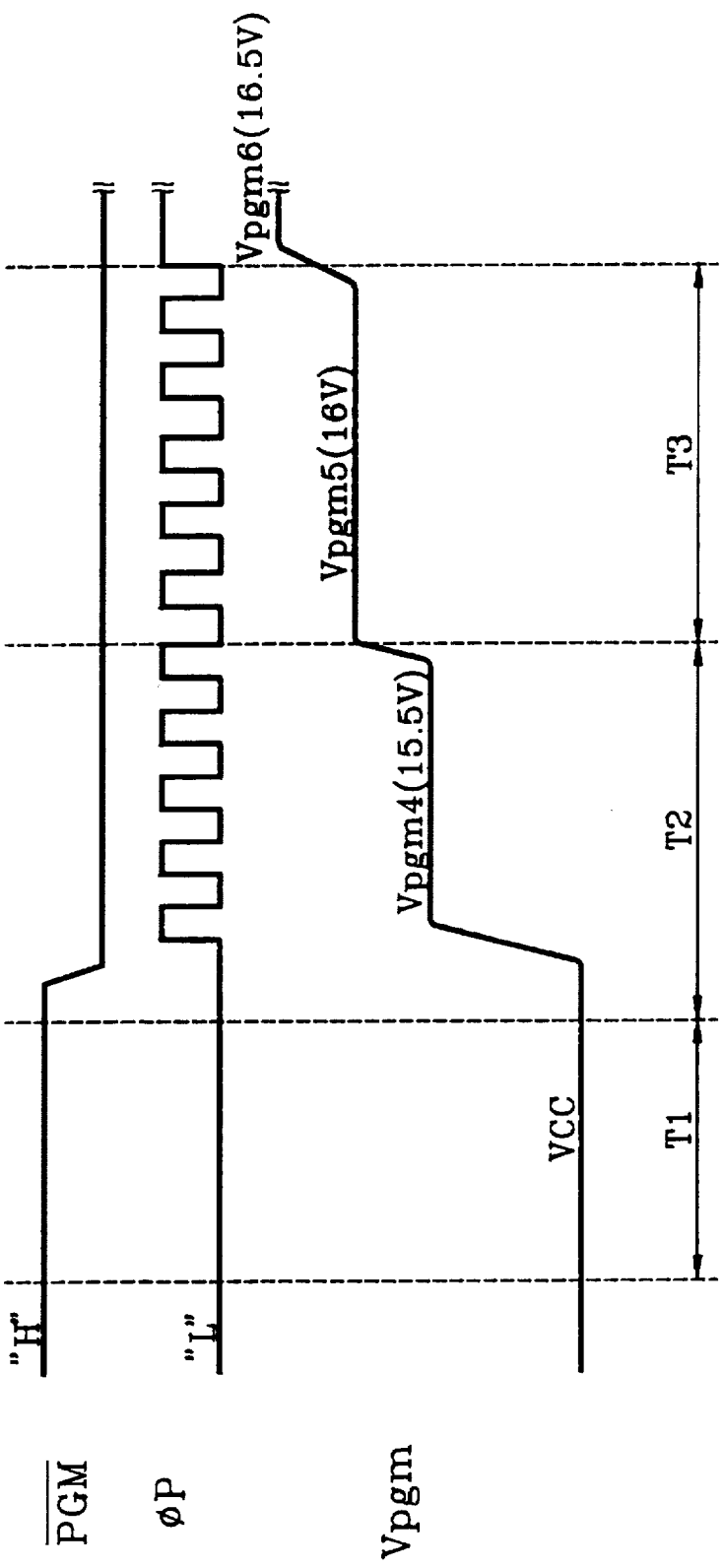

FIGS. 9A–9C are timing diagrams showing the operation of an embodiment of a programming circuit in accordance with the present invention during a programming operation. Referring to FIGS. 9A–9C, the signal Shvrst, which is applied to the circuit of FIG. 4B, goes from a low state to a high state as soon as the device is powered up during the time interval T1, and the signal φhvset of FIG. 4B remains at a low state. This causes the signal φ1chpgm to be activated to a high state. The preliminary counting signals PTRDpgm0, PTRDpgm1 are at a high state, while the preliminary counting signal PTRDpgm2 goes to a low state. Then, the counting signals TRDpgm0, TRDpgm1 go to a low state and the counting signal TRDpgm2 goes to a high state.

Meanwhile, as the automatic program command signal Sapgm goes to a high state during time interval T2, the signal TRDload of FIG. 6 is activated to a high state. Then, the counter output signals RVpgm0–RVpmg3 of the binary counter are driven to the logic L-L-H-L states, respectively, where "L" is the logic low level and "H" is the logic high level. As a result, the signal TRMpgm4 is the only one of the output signals from the trimming decoder 203 of FIG. 7 that is activated to a high state. In this case, the program voltage Vpgm (FIG. 8) is determined by {(R5+R6+R7+R8+Rd+Ru) * Vpref}/(R5+R6+R7+R8+Rd)=15.5 V.

The loop pulse OSP of FIG. 9B, which is applied to the binary counter of FIG. 6, is generated whenever the loop number increases by one, i.e., whenever the programming operation is not verified. The loop pulse, which is generated during the time interval T2, causes the output signals RVpgm0–RVpgm3 from the binary counter to change to the logic states H-L-H-L, respectively, at the start of time interval T3. Therefore, the signal TRMpgm5 is the only of the output signals from the trimming decoder 203 of FIG. 7 that is activated to a high state. In this case, the program voltage Vpgm is determined by {(R6+R7+R8+Rd+Ru) * Vpref}/(R6+R7+R8+Rd)=16 V. It can therefore be appreciated that the program voltage increases by a 0.5 V step when the loop number increases by one, as stated with reference to FIG. 3 (step 310).

Figure 10A:
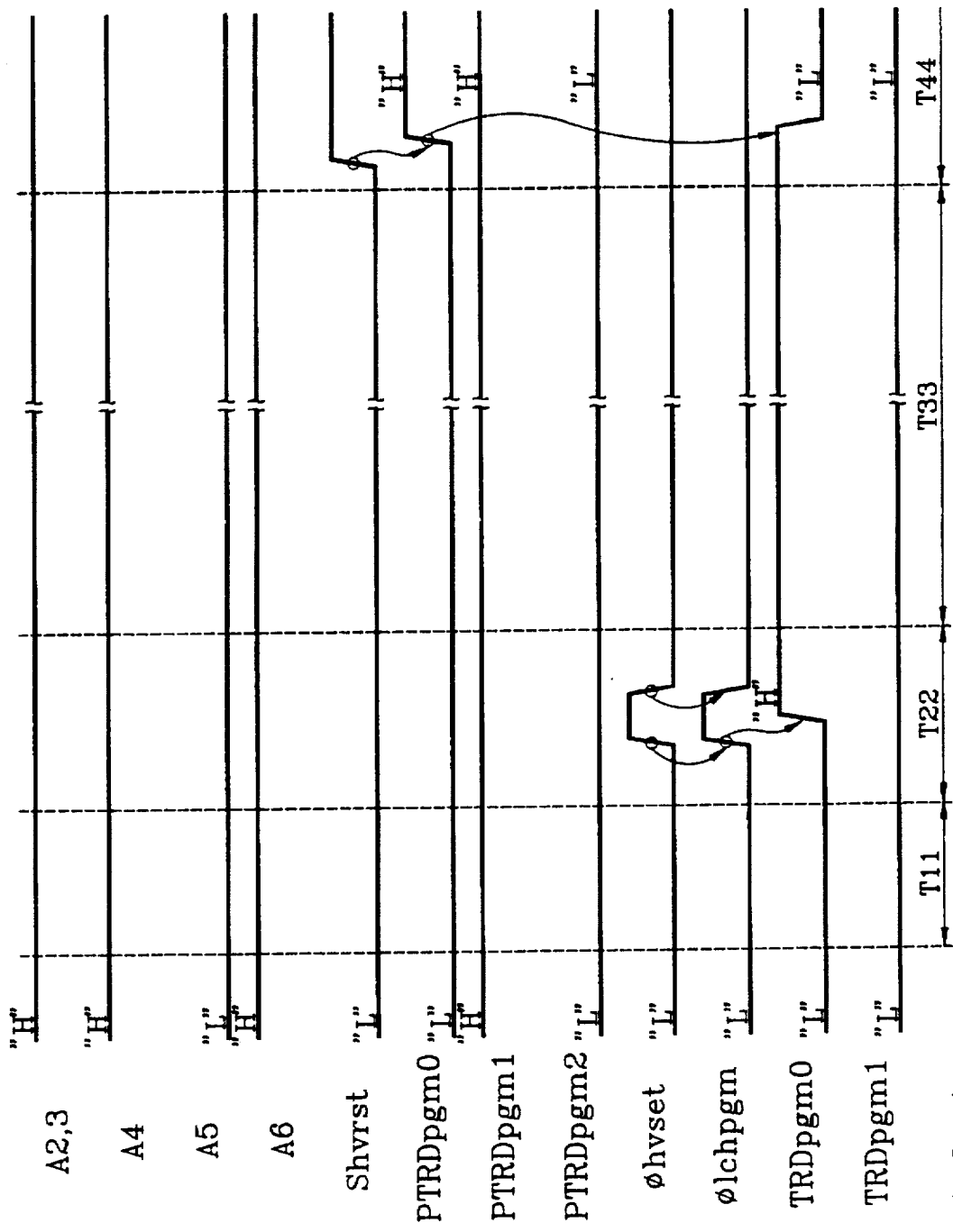
Figure 10B:
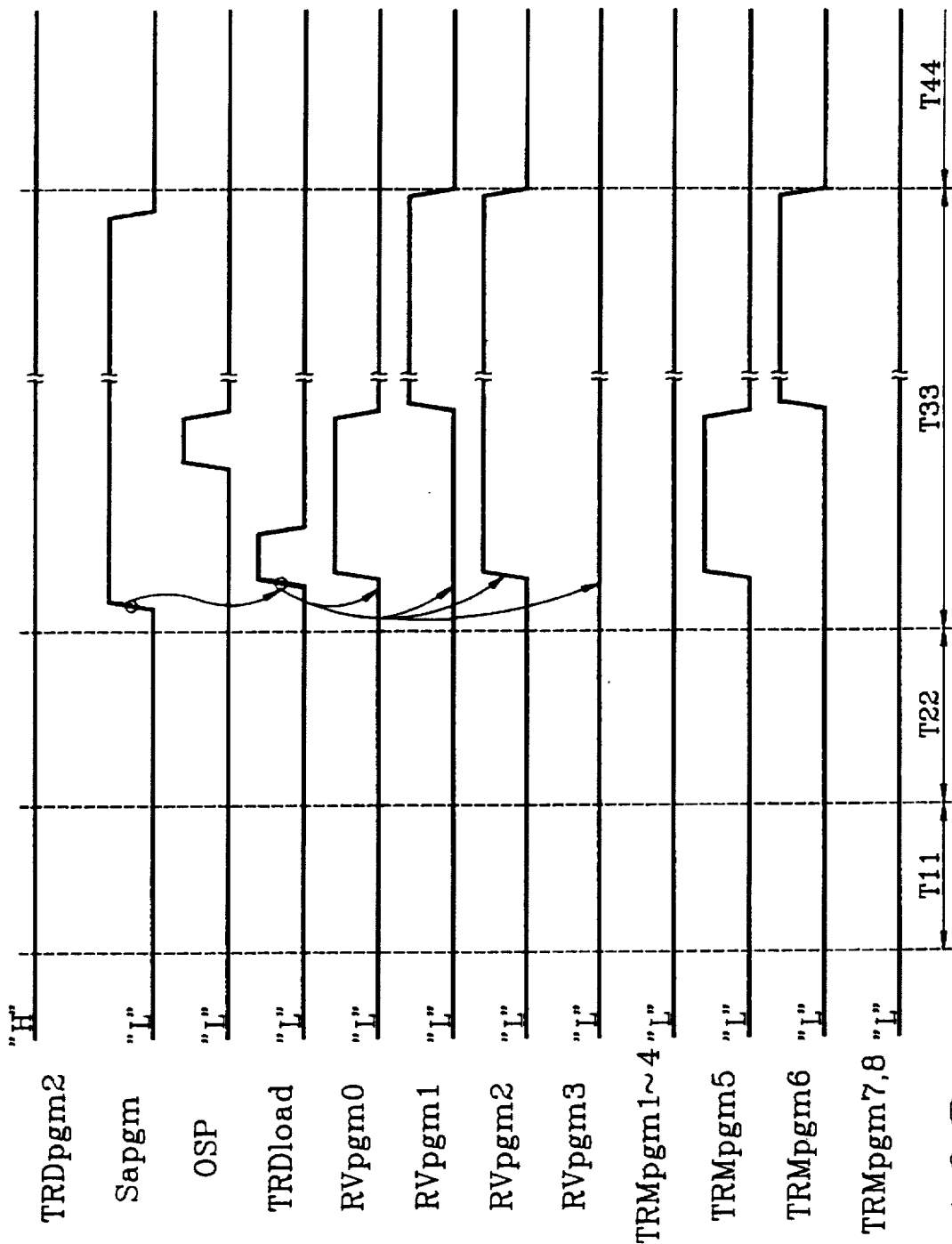
Figure 10C:
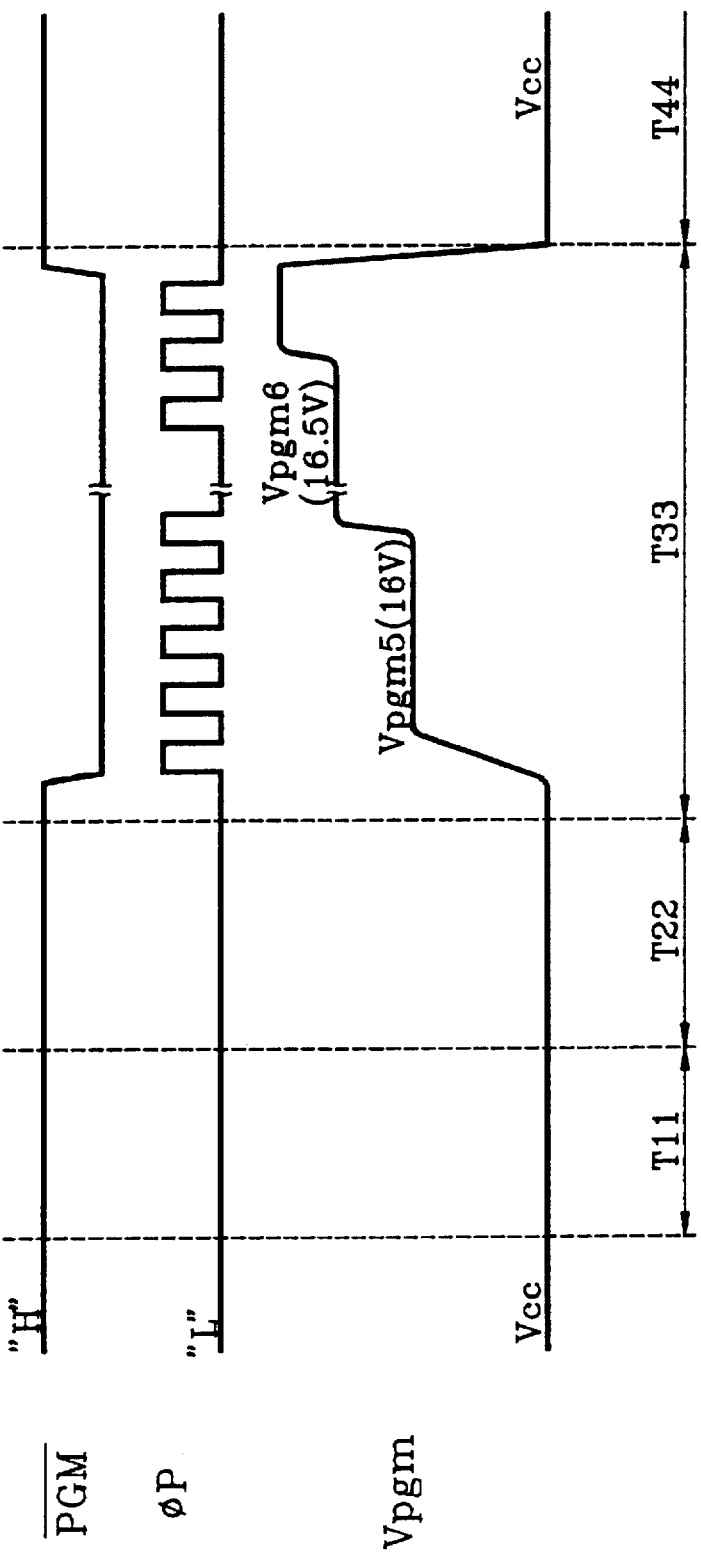

FIGS. 10A–10C are timing diagrams showing the operation of an embodiment of a programming circuit in accordance with the present invention during a test mode operation. Referring to FIGS. 10A–10C, explanation will be given as to how a high voltage optimization circuit according to the present invention increases the program voltage from the optimal initial level during the real operation mode by cutting the fuses after detection of the optimal initial level.

In order to set the initial level at 16 V, the address signals A2–A6 of FIGS. 4A and 4B are at the logic H-H-H-L-H states, respectively, and the preliminary counting signals PTRDpgm0–PTRDpgm2 of FIGS. 4A and 4B are at the logic L-H-L states, respectively, at the beginning of the operation as shown in FIG. 10A. The counting signals TRDpgm0–TRDpgm2 begin at the logic H-L-H states. When the automatic program command signal Sapgm goes to a high state during the program loop interval T33, the signal TRDload of FIG. 6 is activated to a high state. This causes the output signals RVpgm0–RVpgm3 from the binary counter to change to the logic H-L-H-L states, respectively, as shown in FIG. 10B. Therefore, the signal TRMpgm5 is the only one of the output signals from the trimming decoder 203 of FIG. 7 that is activated to a high state. In this case, the program voltage Vpgm is determined by {(R6+R7+R8+Rd+Ru) * Vpref}/(R6+R7+R8+Rd)=16 V. Thus, the initial level is set at 16 V for programming, and increased by 0.5 V whenever the loop number increases by one. In this case, since the preliminary counting signals PTRDpgm0–PTRDpgm2 are at the logic L-H-L states, respectively, as shown in FIG. 10A, the fuse F1 of the first circuit block which generates the signal PTRDpgm0 must be cut out. When this fuse is cut out, the initial level will begin to increase by 0.5 V from 16 V, step by step.

Thus, as described above, a circuit according to the present invention optimizes the initial high voltage level required for erasing and programming the memory cells of a nonvolatile semiconductor memory device, so as to optimize the time required for erasing and programming operations, thereby improving the performance and reliability of the memory device.

What is claimed is:

1. A method for programming a nonvolatile semiconductor memory cell comprising:

applying a programming signal having a relatively low voltage to the cell;

checking the state of the cell;

(a) changing the voltage of the programming signal;

(b) applying the changed programming signal to the cell;

(c) rechecking the state of the cell;

repeating steps (a), (b) and (c) responsive to the state of the cell; and limiting the number of times the voltage is changed including incrementing a counter each time the voltage is changed and repeating steps (a), (b) and (c) until the counter reaches a maximum value.

2. A method for programming a nonvolatile semiconductor memory cell comprising:

applying a programing signal having a relatively low voltage to the cell;

checking the state of the cell;

determining an initial voltage for the programming signal including generating the programming signal, performing a programming operation on the cell using the programming signal, and determining the amount of time required to program the cell;

(d) changing the voltage of the programming signal;

(e) performing a programming operation on the cell using the changed programming signal; and (f) redetermining the amount of time required to program the cell.

3. A method according to claim 2 further including repeating steps (d), (e) and (f) responsive to the amount of time required to program the cell.

4. A method for programming a nonvolatile semiconductor memory cell comprising:

applying a programming signal having a relatively low voltage to the cell;

checking the state of the cell;

determining an initial voltage for the programming signal; and fixing the initial voltage for the programming signal.

5. A method for determining an initial programming voltage for programming a nonvolatile semiconductor memory cell comprising:

generating a programming signal;

performing a programming operation on the cell using the programming signal;

determining the amount of time required to program the cell;

(g) changing the voltage of the programming signal;

(h) performing a programming operation on the cell using the changed programming signal; and (i) redetermining the amount of time required to program the cell.

6. A method according to claim 5 wherein changing the voltage includes changing the voltage responsive to the amount of time required to program the cell.

7. A method according to claim 6 wherein changing the voltage responsive to the amount of time required to program the cell includes changing the voltage if the amount of time required to program the cell exceeds a target programming time.

8. A method according to claim 5 further including repeating steps (g), (h) and (i) responsive to the amount of time required to program the cell.

9. A method according to claim 5 wherein generating a programming signal includes generating a programming signal having a relatively low voltage.

10. A method according to claim 5 further including fixing the initial programming voltage.

11. A nonvolatile semiconductor memory device comprising:

a loop counter for counting programming cycles and generating a voltage control signal responsive to the number of cycles counted; and a programming signal generator coupled to the loop counter to generate a programming signal, wherein the voltage of the programming signal changes responsive to the voltage control signal.

12. A memory device according to claim 11 wherein the loop counter generates the voltage control signal so as to set an initial voltage level of the programming signal responsive to a setting signal.

13. A memory device according to claim 12 further including a register coupled to the loop counter for generating the setting signal.

14. A memory device according to claim 13 wherein the register generates the setting signal responsive to an address signal during a test mode.

15. A memory device according to claim 13 wherein the register includes fuses for fixing the setting signal.

16. A memory device according to claim 11 wherein the loop counter includes:

a trimming counter for generating a counter output signal responsive to a loop pulse signal; and a trimming decoder coupled to the trimming counter for generating the voltage control signal responsive to the counter output signal.

17. A memory device according to claim 11 wherein the programming signal generator includes:

a charge pump for generating the programming signal responsive to a charge pumping signal;

a level detector coupled to the charge pump to divide the voltage of the programming signal responsive to the voltage control signal; and a controller coupled between the charge pump and the level detector for generating the charge pumping signal responsive to the voltage of the programming signal.

18. A memory device according to claim 17 wherein the level detector includes:

a plurality of resistors coupled in series so as to divide the voltage of the programming signal; and a transistor coupled to the plurality of resistors so as to bypass one of the plurality of resistors responsive to the voltage control signal.

19. A method according to claim 1 wherein changing the voltage responsive to the state of the cell includes changing the voltage if the cell is not programmed.

20. A method according to claim 19 further including repeating steps (a), (b) and (c) responsive to the state of the cell.

21. A method for programming a nonvolatile semiconductor memory cell comprising:

counting programming cycles;

generating a voltage control signal responsive to the number of programming cycles counted;

generating a programming signal wherein the voltage of the programming signal changes responsive to the voltage control signal; and programming a memory cell by applying the programming signal to the memory cell.

22. The method of claim 21 including:

generating the programming signal responsive to a charge pump signal;

dividing the voltage of the programming signal responsive to the voltage control signal; and generating the charge pump signal responsive to the voltage of the programming signal.

* * * * *